US011592886B2

(12) United States Patent
Marks et al.

(10) Patent No.: US 11,592,886 B2
(45) Date of Patent: Feb. 28, 2023

(54) ASSESSMENT OF ENERGY CONSUMPTION OF COMPUTER NETWORKS AND USE THEREOF

(71) Applicant: Navier, Inc., Chicago, IL (US)

(72) Inventors: Daniel Marks, Chicago, IL (US);
Joshua Metnick, Chicago, IL (US);
David Steinberg, Chicago, IL (US);
Robert Pieta, Glenview, IL (US)

(73) Assignee: Navier, Inc., Chicago, IL (US)

( * ) Notice: Subject to any disclaimer, the term of this patent is extended or adjusted under 35 U.S.C. 154(b) by 0 days.

(21) Appl. No.: 17/764,297

(22) PCT Filed: Jul. 6, 2021

(86) PCT No.: PCT/US2021/040560
§ 371 (c)(1),
(2) Date: Mar. 28, 2022

(87) PCT Pub. No.: WO2022/010929
PCT Pub. Date: Jan. 13, 2022

(65) Prior Publication Data
US 2022/0334629 A1 Oct. 20, 2022

Related U.S. Application Data

(60) Provisional application No. 63/048,611, filed on Jul. 6, 2020.

(51) Int. Cl.
*G06F 1/28* (2006.01)
(52) U.S. Cl.
CPC ..................................... *G06F 1/28* (2013.01)

(58) Field of Classification Search
CPC ....................................................... G06F 1/28
See application file for complete search history.

(56) References Cited

U.S. PATENT DOCUMENTS 11,025,060 B2 * 6/2021 McNamara ............ G05B 15/02
11,128,165 B2 * 9/2021 McNamara ............... H02J 3/12
(Continued)

FOREIGN PATENT DOCUMENTS

WO 2022010929 A1 1/2022

OTHER PUBLICATIONS

"International Search Report" dated Oct. 12, 2021, for PCT/US2021/040560. International Searching Authority, Patent Cooperation Treaty. pp. 1-3.
(Continued)

*Primary Examiner* — Zahid Choudhury
(74) *Attorney, Agent, or Firm* — Peter K. Trzyna, Esq.

(57) ABSTRACT

An article of manufacture, a machine, process for using the articles and machines, processes for making the articles and machines, and products produced by the process of making, along with necessary intermediates, directed to assessing the energy consumption of networks, typically computer networks, and/or applications of assessments made thereby. Industrial applicability is representatively directed to energy consumption/conservation and efficiency, such as in networks, along with control and implementation therefrom, as well as in networking, control systems communications and related systems, receiver systems, and components used in assessing and carrying out the same.

31 Claims, 3 Drawing Sheets

Structure of a network.

Log entries example for a particular computational network (example for cryptocurrency mining)

(56) References Cited

U.S. PATENT DOCUMENTS

| | | |
|---|---|---|
| 11,397,999 B2* | 7/2022 | McNamara ............... G06F 1/26 |
| 2007/0255461 A1 | 11/2007 | Brickfield et al. |
| 2010/0283606 A1 | 11/2010 | Tsypin et al. |
| 2011/0239010 A1 | 9/2011 | Jain et al. |
| 2012/0041696 A1 | 2/2012 | Sanderford, Jr. et al. |
| 2013/0305075 A1 | 11/2013 | Vasan et al. |

OTHER PUBLICATIONS

"Written Opinion of the International Searching Authority" dated Oct. 12, 2021, for PCT/US2021/040560. International Searching Authority, Patent Cooperation Treaty. pp. 1-9.

Chang et al. "Assessment of energy consumption in wireless sensor networks" 2007 IEEE International Conference on Mobile Adhoc and Sensor Systems. Oct. 11, 2007. pp. 1-9.

* cited by examiner

Figure 1. Structure of a network.

Figure 2. Log entries for a computer network showing energy consumed and work increments performed by each compute unit.

$$\begin{bmatrix} A_{11}(t_2-t_1) & H_{21}-H_{11} & A_{12}(t_2-t_1) & H_{22}-H_{12} & \cdots & A_{1n}(t_2-t_1) & H_{2n}-H_{1n} \\ A_{21}(t_3-t_2) & H_{31}-H_{21} & A_{22}(t_3-t_2) & H_{32}-H_{22} & \cdots & A_{2n}(t_3-t_2) & H_{3n}-H_{3n} \\ \cdots & \cdots & \cdots & & & & \\ A_{i-1,1}(t_i-t_{i-1}) & H_{i,1}-H_{i-1,1} & A_{i-1,2}(t_i-t_{i-1}) & H_{i,2}-H_{i-1,2} & \cdots & A_{i-1,n}(t_i-t_{i-1}) & H_{i,n}-H_{i-1,n} \end{bmatrix} \begin{bmatrix} P_1 \\ R_1 \\ P_2 \\ R_2 \\ \cdots \\ P_n \\ R_n \end{bmatrix}$$

$$= \begin{bmatrix} E_2 - E_1 \\ E_3 - E_2 \\ \cdots \\ E_i - E_{i-1} \end{bmatrix}$$

Figure 3. An example of the linear equations in matrix-vector notation to solve for the baseline and computational increment power used by the compute units.

Figure 4. An example subroutine of a command computer decision procedure for solving for the baseline and computational increment power used by the compute units.

Figure 5 An example of a command computer decision procedure for reconfiguring the network based on the assessed energy consumption of compute units.

ASSESSMENT OF ENERGY CONSUMPTION OF COMPUTER NETWORKS AND USE THEREOF

I. PRIORITY

This application claims the benefit of U.S. Provisional Patent Application No. 63/048,611, filed Jul. 6, 2020, and entitled "Assessment of Energy Consumption of Computer Networks and Use Thereof", which is hereby incorporated by reference in its entirety as if fully restated herein.

II. BACKGROUND

Large networks of computers performing unsupervised computations are often sited at locations where surplus electricity is available to minimize energy costs which are a major expense when operating a network for a particular computational load. Cryptocurrency transactions are a significant example of such unsupervised computations, however, other highly parallelizable and low network overhead tasks such as protein folding, finite element simulations, neural network learning, Monte Carlo financial simulations, gene sequencing, and encryption/decryption share these properties. Besides the computational hardware and maintenance costs, the cost of these computations is largely the energy used. To be able to accurately price computational capacity, an accurate assessment of the amount of energy consumed for a given amount of computation is required. Unfortunately, utility-grade electrical metering equipment is quite expensive and therefore tracking the energy consumption of every computer using individual meters would add considerable cost to the deployment of the network.

III. SUMMARY

This disclosure uses different prophetic embodiments to teach the broader principles with respect to articles of manufacture, apparatuses, processes for using the articles and apparatuses, processes for making the articles and apparatuses, and products produced by the process of making, along with necessary intermediates, directed to assessing the energy consumption of networks, typically computer networks, and/or applications of assessments made thereby, This Summary is provided to introduce the idea herein that a selection of concepts is presented in a simplified form as further described below. This Summary is not intended to identify key features or essential features of subject matter, nor this Summary intended to be used to limit the scope of claimed subject matter. Additional aspects, features, and/or advantages of examples will be indicated in part in the description which follows and, in part, will be apparent from the description, or may be learned by practice of the disclosure.

Any references cited herein are incorporated by reference as if fully stated herein. The following description and drawings are illustrative and are not to be construed as limiting. Numerous specific details are described to provide a thorough understanding of the disclosure. However, in certain instances, well-known or conventional details are not described to avoid obscuring the description. References to one or an embodiment in the present disclosure can be, but not necessarily are, references to the same embodiment; and such references mean at least one of the embodiments.

Reference in this specification to "one embodiment" or "an embodiment" means that a feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only and is not intended to further limit the scope and meaning of the disclosure or of any exemplified term. Likewise, the disclosure is not limited to various embodiments given in this specification.

Without intent to limit the scope of the disclosure, examples of instruments, apparatus, methods, and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

With the foregoing in mind, consider an article of manufacture, a machine, process for using the articles and machines, processes for making the articles and machines, and products produced by the process of making, along with necessary intermediates, directed to assessing the energy consumption of networks, typically computer networks, and/or applications of assessments made thereby. For example, consider a system for accurately assessing the energy usage of a computational network while minimizing the number of utility-grade meters. By designing the system so that the energy usage may be correlated with more easily and inexpensively logged information regarding the computational work done, the energy usage of computations may be inferred with great detail while minimizing the amount of power metering required.

IV. INDUSTRIAL APPLICABILITY

Industrial applicability is representatively directed to energy consumption/conservation and efficiency, such as in networks, along with control and implementation therefrom, as well as in networking, control systems communications and related systems, receiver systems, and components used in assessing and carrying out the same. Any and all of which are applicable to electrical engineering, energy, and computer science industries, as well as industries operating in cooperation therewith.

VI. MODES

Figure 1:
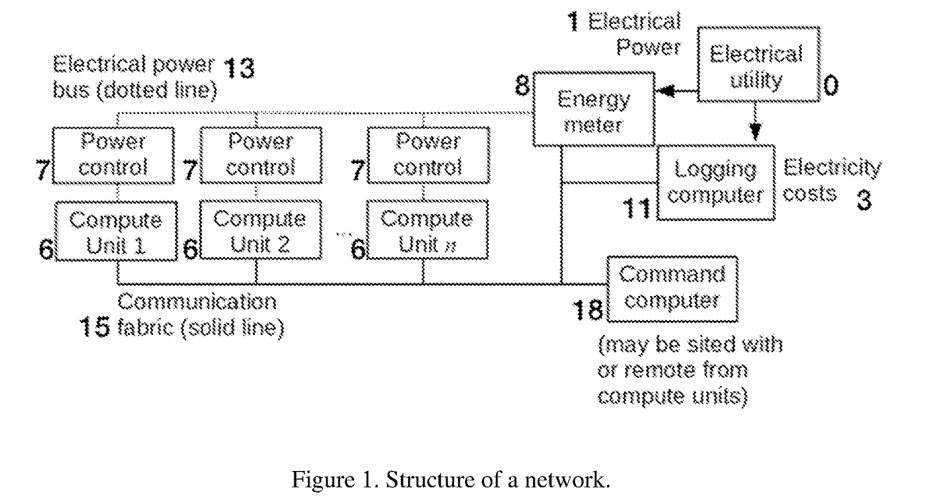
FIG. 1 is an illustration of a network.

There can be a network comprising compute units, a communication fabric 15 which enables communication between the compute units 6 and between the compute units 6 and command computer 18 or computers; a logging computer 11 that may be the same computer or separate computer from the command computer 18 or computers and that accumulates data about the cumulative energy consumption and computational work performed by compute units 6; an electrical power bus 13 that delivers power to the compute units 6 from a power source such as an electrical utility 0, power control units 7 for the compute units 6 (depending on the embodiment, a power control 7 unit may be separate from, or part of, one or more of the compute units 6) adapted to control the flow of electrical power 1 to the compute units 6, and an energy meter 8 connected to the power bus 13 that is able to measure and report the aggregate energy consumed by the compute units 6 that comprise the computer network. FIG. 1 shows the structure of the computer network. The compute units 6 perform that actual work of computation for the particular designed task or tasks, for example, cryptocurrency mining. A compute unit 6 may contact a command computer 18 to obtain instructions and data for work to be performed by the compute unit 6. For example, a cryptocurrency miner compute unit 6 might contact a pool, serving as the command computer 18, to obtain a job block which determines the hashing work to be performed by the miner. The command computer 18 may or may not be on the same communication fabric 15 that connects the compute units 6, e.g., may be on an external network that is connected or routed to the communication fabric 15. As the amount of bandwidth required to transmit instructions and data is typically small, and the communication required is relatively infrequent, a high bandwidth connection is usually not required between the compute units 6 and the command computer 11 so that the compute units may be placed at a facility remote from a command computer 18 and in proximity to available electrical power 1.

The electrical power 1 delivery to the network is configured so that the energy meter 8 measures the total energy delivered (for example in kilowatt-hours or kWh) in aggregate to essentially all the compute units 6 in a given network. It is assumed that at any given time, the meter 8 may be queried and report the total accumulated consumed electrical power 1 by the network to that time. Therefore, by querying the energy meter 8 at the beginning and end of an interval, the total amount of energy consumed during the interval can be inferred by subtracting the two measurements. The power delivered to a network is usually given by the resistive power, or the net energy consumed by the load. However, if the cost of electrical power 1 as priced by the electrical utility 0 is also related to the reactive power, or stored energy by the load, most energy meters report that as well and this quantity can also be recorded so that the true cost of power may be accounted for. For most modern computational devices, the power factor, or the degree to which the power consumed by the load is resistive rather than reactive, is near 100%, and so with modern power supplies this is rarely a consideration.

The compute units 6 are typically chosen to be identical or nearly identical units, so that on a given network there may be a small number of different compute unit 6 types. As identical compute units 6 given similar loads are expected to consume similar amounts of power, the power consumed by a number of compute units 6 should scale linearly with the number of units 6. Therefore, to estimate the power consumed by a given compute unit 6, one can use the total amount of power 1 consumed by a network during an interval, and the number of each type of compute unit 6 that were working during that interval. If the power 1 consumed by the network is measured with different numbers of compute units 6 working over different intervals, a set of equations may be stated and solved which provide estimates of the power consumption each type of compute unit 6.

Figure 2:
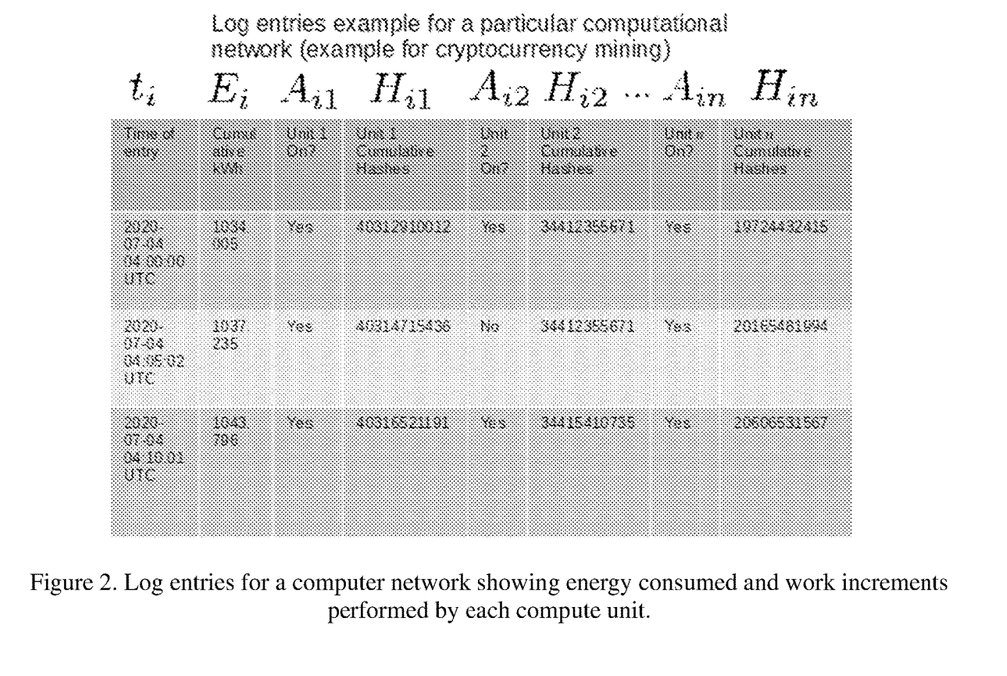
FIG. 2 is an illustration of log entries for a computer network showing energy consumed and work increments performed by each compute unit.

For a given computer network, a log is maintained with the log entries including the time of the entry, denoted $t_i$, and the accumulated energy consumption of the computer network recorded by the energy meter 8 up to that time, denoted by $E_i$, with i being the index of a time interval. An example of the log entries is shown in FIG. 2. Typically, the log would be kept by a database 10 with the entries gathered by periodically querying the compute units 6 and energy meter 8. The computational work performed by the compute units 6 may be inferred by either interrogating the compute units 6 or the command computer 18 that assigned the work, depending on which source of information provides a sufficiently accurate accounting of the work. Also included in each entry is the computational work performed by each compute unit 6 during the interval i, with each unit 6 being assigned an index n. The computational work is measured in a number of increments appropriate to the workload being performed, for example, the number of hashes performed during the interval of a cryptocurrency miner, number of iterations of a Monte Carlo simulation, etc., each increment consuming the same amount of energy on average. The energy consumed by the unit is partially determined by a baseline amount of power, $P_n$, which the unit 6 consumes as long as it is powered on regardless of the computational load during the interval. The energy consumed also has a second component that is proportional to the amount of computational work done. The amount of computational work done for compute unit 6 during interval i is given by $H_{in}$ and is known to the compute unit 6, with $H_{in}$ also being stored in the log entry for the corresponding time interval. Furthermore, each compute unit 6 may be completely powered down and therefore consuming no power, which is indicated by a variable $A_{in}=\{0,1\}$ with zero indicating the unit is turned off completely and consuming no power, and one indicating the unit 6 is turned on during the interval i. The state of whether each compute unit 6 is on or off during each interval is also recorded in the log. In some cases, it can be advantageous to power down compute units 6 during intervals where energy costs 3 are excessive so that even nominal amounts of power are not consumed by the compute units 6. Each unit 6 consumes an amount of energy consumed per computational increment given by $R_n$ which may be unknown and need to be estimated. Thus, embodiments can allow the estimation of the energy consumed of a unit 6 per computational increment so that, given a log of the computational work performed by the unit 6, the energy consumed by the unit 6 may be estimated and therefore, used, for example, for more accurate pricing of computational resources.

To estimate this energy consumed per computational increment $R_n$, note that for any given two-time interval between the time points indexed by i, it becomes apparent that $$\sum_n A_{in} P_n (t_{i+1} - t_i) + R_n (H_{i+1,n} - H_{in}) = E_{i+1} - E_i$$

This equation is an accounting of the total energy consumed by the network during the interval. For each computer indexed by on the network, the baseline power is given by $A_{in} P_n (t_{i+1} - t_i)$ which is determined by whether or not the unit is powered on, the baseline power consumed by the unit 6 while it is powered on, and the interval of time it is powered on. It is secondly determined by the total amount of energy consumed by the computation itself $R_n(H_{i+1,n} - H_{i,n})$. The sum of the energy used must equal the total energy consumed during the interval $E_{i+1} - E_i$. In general, it is unknown before measurements of the total power are made the energy used per computational increment $R_n$ of each unit as well as the baseline power $P_n$ of each unit as the energy meter is not connected individually to the units.

If the units on a given network are all essentially of the same type, this relation simplifies to $$P(t_{i+1} - t_i) \sum_n A_{in} + R \sum_n (H_{i+1,n} - H_{in}) = E_{i+1} - E_i$$

with P being the identical baseline power of each unit 6 and R being the identical energy consumed per computational increment of each unit 6.

The above equations correspond to a single time interval or log entry. Two log entries are sufficient if a single unknown quantity is to be estimated. In practice, usually the energy used per computational increment $R_n$ and baseline power $P_n$ is to be estimated and so a single log entry does not unambiguously estimate these quantities. In general, a set of simultaneous linear equations, with each equation corresponding to an interval, must be solved to find $R_n$ and $P_n$. The minimum number of log entries required to estimate a number of unknown quantities is one more than the number of unknowns.

Figure 3:
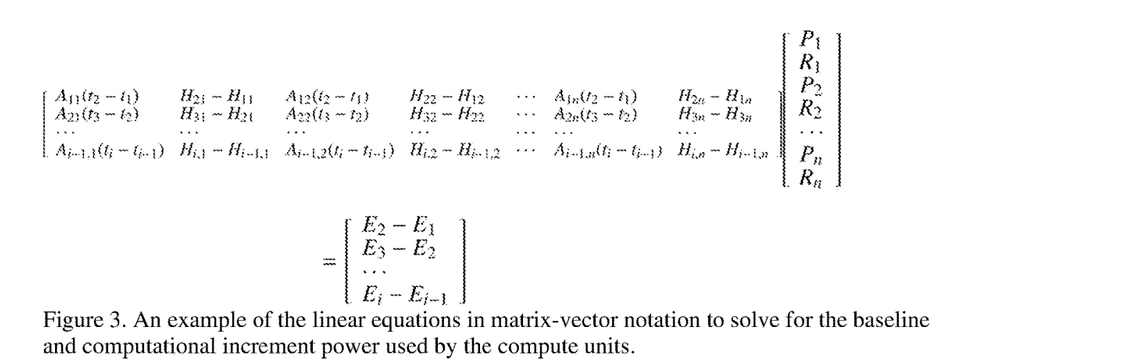
FIG. 3 illustrates an example of the linear equations in matrix-vector notation to solve for the baseline and computational increment power used by the compute units.

FIG. 3 shows an example of linear equations that may be formed from the log entry data. In general, with frequent logging, it is likely that far more than the minimum number of log entries will be available. In this case, methods such as a pseudoinverse solution may be applied to solve the linear system in the least-squares sense, improving the estimate over using a solution using such the minimum amount of information required. FIG. 3 illustrates an example of the linear equations in matrix-vector notation to solve for the baseline and computational increment power used by the compute units. In general, these equations are overdetermined and are solved with a least-squares solution, for example.

Sometimes, this linear system formed by these equations is poorly conditioned or rank deficient. This is because an insufficient variation in the behavior of the compute units 6 has not occurred to distinguish the differences in energy consumption with differing behavior. For example, if a compute unit 6, when it is on, always performs the same number of increments of computational work, the total energy consumed by the compute unit 6 over an interval is always the same and therefore the baseline power and energy consumed by computation cannot be distinguished. Likewise, if essentially all the compute units 6 are turned on or off at the same time, the baseline power of individual compute units 6 cannot be distinguished. The rank deficiency of the linear system is because the data collected is insufficient to find the desired quantities.

It is possible to reformulate the equations so that quantities that cannot be estimated given the data can be aggregated into quantities that can be estimated. For example, if essentially all of the compute units 6 are turned on or off at the same time, one can still estimate the total baseline power consumed by essentially all of the compute units 6, for example by rewriting the equation as:

$$PN(t_{i+1} - t_i) + R \sum_n (H_{i+1,n} - H_{in}) = E_{i+1} - E_i$$

with N being the total number of compute units 6 with identical baseline power consumption P and R is the energy consumed per computational increment.

To check the validity of the estimates of $R_n$ and $P_n$, one can perform the fitting of these parameters with different subsets of intervals from the logs. Ideally, these the estimates of these parameters vary minimally and do not depend on which interval the energy consumption is measured in, so significant deviation of these parameters using estimates derived from different intervals indicate possible systematic errors in the measurements or problems with the model. This is a cross-validation technique that uses one subset of the data to check the consistency of another. Furthermore, it may be desirable to install a small number of utility meters on individual compute units to measure the actual energy consumption to compare to the estimated quantities. Deviations may indicate systematic errors in measurement, model errors, or unaccounted energy consumed in the network.

With sufficiently accurate estimates of $R_n$ and $P_n$, the log may be consulted as to determine during an interval of interest the total time each compute unit 6 has been powered on, and how many increments of work were performed by the unit during the interval. The total energy consumed may then be calculated as $$\Delta E = \sum_i \left[ \sum_n A_{in} P_n (t_{i+1} - t_i) + R_n (H_{i+1,n} - H_{in}) \right]$$

which is summed over all the units 6 and intervals for which the energy consumption should be accumulated. This may in turn be used, for example, for billing purposes, so that the portion of the charge of the maintenance of the computer network which is due to consumed energy may be appropriately priced. Of course, the actual price of the electricity used also depends on the metering rate during the intervals the computation was performed, so those rates, as provided by the electrical utility, may need to be logged as well.

Figure 4:
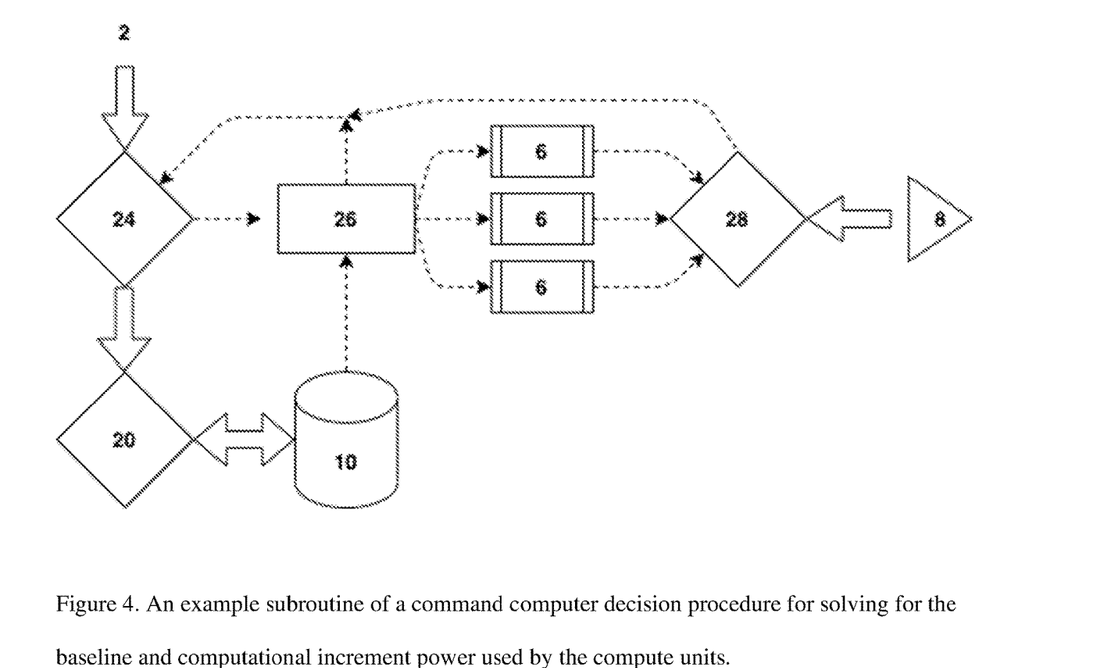
FIG. 4 illustrates an example subroutine of a command computer decision procedure for solving for the baseline and computational increment power used by the compute units.

FIG. 4 illustrates an example subroutine of a command computer 18 decision procedure for solving for the baseline and computational increment power used by the compute units 6. The subroutine inputs 2 are at least one time interval, the network energy consumption during each time interval, the computational work performed by each compute unit 6 during the time interval, the type of each compute unit 6, the on or off status of each compute unit 6, and the baseline power and power consumption of each compute unit 6, if known. Using the inputs, subroutine 24 determines a linear system of equations like the linear system in FIG. 3 and determines if the linear system of equations is solvable, for example by checking whether the number of unknown variables is less than the number of input time intervals:

i. If the linear system of equations is not solvable, subroutine 26 uses the baseline power and power consumption of known compute unit 6 types to fill in unknown variables in the linear system of equations.
  a. If the linear system of equations is now solvable, subroutine 26 returns to subroutine 24.
  b. If the linear system of equations is still not solvable, subroutine 28 turns off half of the largest group of compute units of similar type. Subroutine 28 then observes the network for at least one time interval, getting the energy reading from the energy meter 8 and the computational work performed by each compute unit 6, and adds the observations to the inputs. Subroutine then recurses to passing the observation as part of the next inputs 2.
ii. If the linear system of equations is solvable, subroutine 20 solves the linear system of equations and saves the solution in the database 10.

In another embodiment, an additional compute unit is added to existing compute units 6. The additional compute unit is of similar type to the existing compute units 6, and a previous energy assessment is saved in the database 10. Subroutine 26 uses the baseline power and power consumption of similar compute units from a previous energy assessment saved in the database 10 to determine the baseline power and power consumption of the new compute unit. Subroutine 26 then modifies the inputs 2 with the baseline power and power consumption of the additional compute unit and returns to subroutine 24.

In another embodiment, a compute unit 6 is removed from the existing compute units 6. The removed compute unit is of similar type to the remaining compute units 6, and a previous energy assessment is saved in the database 10. Subroutine 20 uses the baseline power and power consumption of the remaining compute units 6 from a previous energy assessment saved in the database 10 to solve the linear system of equations.

Given the foregoing, the assessment can be variously used. For example, there can be a decision procedure as to when power is inexpensive enough so that the user/service (e.g., cryptocurrency mining) can be offered at or below a target price. If (but only if) it can be, then the computation is enabled, and power is consumed by the computation. The computation can be enabled on a compute unit 6 by either using a power control unit 7, such as a remote switch, to power on or off the compute unit 6, or to limit the number amount of work a compute unit 6 performs by limiting the number or size of the jobs assigned to the compute unit 6. So, there can be an element which determines the cost of a proposed computation as can be calculated by using rate information from the power utility 0. Such uses can, but need not always, involve the power utility 0 and its electricity costs 3 incorporated into the assessment, and sometimes with a trigger to enable or disable the computations (for example, powering on or off machines, or assigning work to computed units 6 or not). In this manner, there can be a system to allocate power usage between computation units 6.

Figure 5:
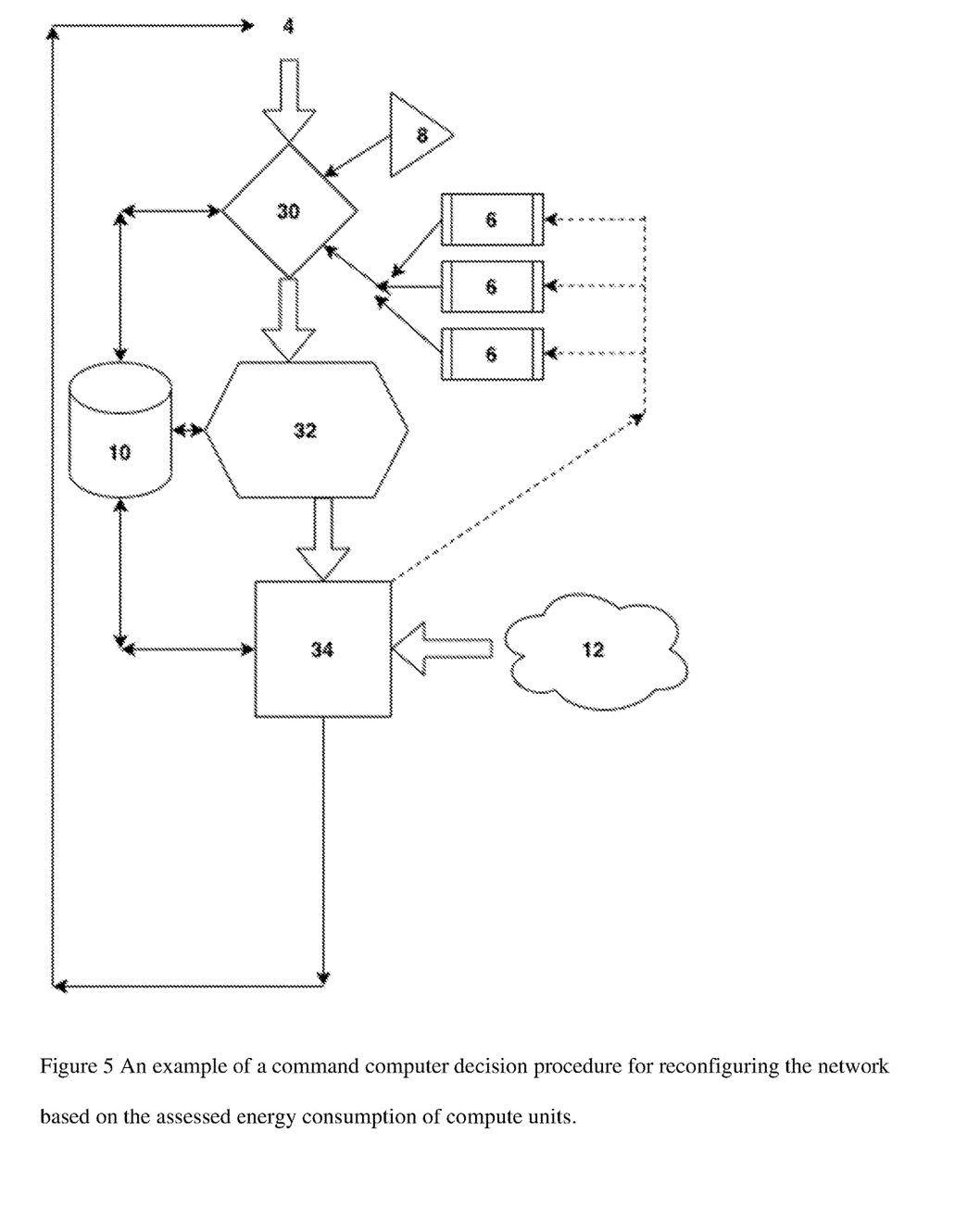
FIG. 5 illustrates an example of a command computer decision procedure for reconfiguring the network based on the assessed energy consumption of compute units.

FIG. 5 illustrates an example of a command computer 18 decision procedure adapted to change the network based on the assessed energy consumption of compute units 6. The decision procedure input 4 is a time interval. A time interval specifies a start and end time, for example using a UNIX timestamp like 1622041000. A decision procedure may be configured to recur, for example every 1000 seconds producing an input time interval like 1622041000 to 1622042000. Subroutine 30 gets the energy consumed by the network from the energy meter 8 for the input time interval. Subroutine 30 gets the on/off state and computational work performed for each compute units 6 during the time interval from each compute unit 6. Subroutine 32 gets previous time intervals, previous energy assessments during previous time intervals, computational work performed for each compute unit 6 during previous time intervals, on/off state of each compute unit 6 during previous time intervals, the type of each compute unit 6, and the baseline power and power consumption of each compute unit 6 if known from the database 10. Subroutine 32 performs an energy assessment subroutine like the subroutine in FIG. 4 to obtain the energy consumed by each compute unit 6 during the time interval. Subroutine 34 gets the current price of power from an external data source 12. Subroutine 34 saves the information to the database 10 and uses the information to reconfigure the network. For example, the price of power may be $1 per Wh as provided by an external data source. A target amount may be configured to $2 per computational work increment performed. By combining the energy assessment E in Wh, computational work C in unit increments, and price of power P during a time interval in $/Wh, the price of a computational work increment D per compute unit 6 may be computed as $(E*P)/C=D$. If D is more than the target amount $2 for a compute unit 6, the decision procedure may regulate that compute unit 6 off.

In another embodiment, Subroutine 34 is adapted to configure the network by assigning computational work to compute units 6 and the external data source 12 provides the price per cryptocurrency computational work and the price of power. For example, the price of power may be $1 per Wh, the price per cryptocurrency ACoin computational work may be $2, and the price per cryptocurrency BCoin computational work may be $3 as provided by an external data source. By combining the energy assessment E in Wh, computational work C in unit increments, price of power P during a time interval in $/Wh, and price of cryptocurrency computational work H, the return per cryptocurrency computational work increment D per compute unit may be computed as $H*((E*P)/C)=D$. If D for BCoin is larger than D for ACoin, the decision procedure may assign the compute units computational work related to BCoin.

In another embodiment, the price per cryptocurrency computational work may be specific to each compute unit 6 and a predetermined criteria may be configured to a target amount of $1 per Wh, the price per cryptocurrency ACoin computational work may be $2, and the price per cryptocurrency BCoin computational work may be $3 as provided by an external data source. By combining the energy assessment E in Wh, computational work C in unit increments, price of power P during a time interval in $/Wh, and price of cryptocurrency computational work H, the return per cryptocurrency computational work increment D per compute unit may be computed as $H*((E*P)/C)=D$. If D for BCoin is larger than D for ACoin, the decision procedure may assign the compute units 6 computational work related to BCoin.

In another embodiment, the price per cryptocurrency computational work may be specific to each compute unit 6 and a predetermined criteria may be configured to a target amount of $1 per cryptocurrency computational work increment performed. For example, the price of power may be $1 per Wh, the price per cryptocurrency ACoin computational work may be $2 for compute unit type 1 and $3 for compute unit 6 type 2, and the price per cryptocurrency BCoin computational work may be $3 for compute unit type 1 and $2 for compute unit 6 type 2 as provided by an external data source. By combining the energy assessment E in Wh, computational work C in unit increments, price of power P during a time interval in $/Wh, and price of cryptocurrency computational work H[t] for compute unit type t, the return per cryptocurrency computational work increment D[c] per compute unit c may be computed as $H[t]*(E*P)/C)=D[c]$. For each compute unit 6, if D[c] for BCoin is larger than D[c] for ACoin, the decision procedure may assign the compute units 6 computational work related to BCoin unless D[c] for both ACoin and BCoin is less than the preset target, in which case the compute unit 6 may be turned off.

Another example of using the assessment is in determining whether a computation or certain computing is economically feasible. For example, the above-discussed assessment enables determination of whether or not a computation or certain computing can "pay for itself," e.g., provide more benefit by having the computation or computing performed than the cost in power used. For cryptocurrency, this allows determining whether the expected value of the mined currency (as currency mining is a random process) would be greater than cost of the expected power used to mine the currency. In other contexts, this can be extended to other computation processes such as those that assess financial instruments, e.g., simulation of contract or derivative outcomes to determine whether, under expected scenarios, the energy costs of the simulation of contract or option scenarios are likely to exceed the financial benefit of purchasing and exercising such a contract or option.

In yet another example of using the assessment, the computer network can be arranged and rearrangement to one of many different configurations, with different compute units 6 being turned on and off to effect different combinations of compute units, based on the assessment. It is believed to be unconventional to arrange computer components based on the above-described assessment. It is precisely because different combinations of compute units 6 are turned on and off and have the aggregate power of the compute units 6 measured with some of them performing work and others not, via enabling the measurement by the energy meter 8 to assess the energy consumption of individual compute units 6 using only aggregate measurements of energy consumed from all of the compute units 6. Individually measuring the power consumption of individual compute units 6 is typically prohibitively expensive if utility-grade metering of the compute units 6 is required. So, the rearrangement of the computer network components by having subsets of the compute units 6 perform work can be another application of the assessment.

In a further example of using the assessment, there can be a core computer system made available to other entities, such as those performing cryptocurrency mining, the core keeping track of the hashing activity of cryptocurrency miners. In some cases, for example, one or more of the compute units is/are known by the command computer 18 as compute unit of one entity (e.g., a company, individual, etc.), and the assessment of energy consumption for each of the compute units 6 is applied, by the command computer 18, such that the network is changed by allocating a portion (e.g., the one or more) of the compute units 6 of one entity to another entity. The assessment can be incorporated into a core to help miners, e.g., to help miners evaluate the return for their processing in view of costs—utility cost being a significant aspect of mining profitability.

In yet still another example, the assessment can be applied to computing farms. For example, it is believed that computing services such as Amazon Web Services (AWS) AWS or Microsoft Azure currently prioritize siting computational resources near network hubs rather than near sources of inexpensive electrical power, as the loads typically require high network traffic and relatively low computation loads. But as renewable energy becomes more prevalent and network speeds increase, these services can be sited near renewable sources because network traffic, especially traffic that is not sensitive to high latency (such as multimedia delivery) can be sited near power sources, while electrical power losses increase away from their generation source and therefore decrease energy efficiency and increase costs. However, renewable sources are less reliable than fossil fuel and nuclear energy so that energy prices fluctuate with increased demand and decreased supply, and so computational work may be performed at locations where power is a lower cost. Thus, the assessment of compute unit energy consumption can be applied in siting and/or determining whether a computing service such as AWS or Microsoft Azure could be economically used at given site at a given time.

Also, the assessment can be used in an aspect of pricing or charging for compute services based on market power prices or surplus power availability. For example, the pricing or charging can include the power of individual compute units inferred from aggregate measurements, and/or the pricing of, or charging for, the computation being based on the power estimated from such measurements. In addition, based on estimates of energy consumption of compute units and historic logged electricity costs, the price may be calculated of options contracts that hedge the cost of the energy required for future computation jobs. An accurate assessment of compute units 6 energy consumption can therefore enable the capacity to perform future computational work to be purchased and exchanged as a commodity.

In sum, it is important to recognize that this disclosure has been written as a thorough teaching rather than as a narrow dictate or disclaimer. Reference throughout this specification to "one embodiment", "an embodiment", or "a specific embodiment" means that a particular feature, structure, or characteristic described in connection with the embodiment is included in at least one embodiment and not necessarily in all embodiments. Thus, respective appearances of the phrases "in one embodiment", "in an embodiment", or "in a specific embodiment" in various places throughout this specification are not necessarily referring to the same embodiment. Furthermore, the features, structures, or characteristics of any specific embodiment may be combined in any suitable manner with one or more other embodiments. It is to be understood that other variations and modifications of the embodiments described and illustrated herein are possible in light of the teachings herein and are to be considered as part of the spirit and scope of the present subject matter.

It will also be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/Figures should be considered only as exemplary, and not limiting, unless otherwise specifically noted, e.g., a one-way signal arrow could, in another embodiment, be bidirectional or opposite. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise. Variation from amounts specified in this teaching can be "about" or "substantially," to accommodate tolerance for such as acceptable manufacturing tolerances.

The foregoing description of illustrated embodiments, including what is described in the Abstract and the Modes, and all disclosure and the implicated industrial applicability, are not intended to be exhaustive or to limit the subject matter to the precise forms disclosed herein. While specific embodiments of, and examples for, the subject matter are described herein for teaching-by-illustration purposes only, various equivalent modifications are possible within the spirit and scope of the present subject matter, as those skilled in the relevant art will recognize and appreciate. As indicated, these modifications may be made in light of the foregoing description of illustrated embodiments and are to be included, again, within the true spirit and scope of the subject matter disclosed herein.

The invention claimed is:

1. An apparatus including:
  a network comprising:
    compute units that each perform computational work, not all of the compute units having an individual electrical power meter,
    a power control unit for one or more of the compute units, each said power control unit located to control flow of electrical power to said one or more compute units,
    an electrical power bus that delivers electrical power to each said power control unit,
    an energy meter that measures energy delivered to the electrical power bus,
    a command computer, and
    a communication fabric that allows communication between the compute units and said command computer, wherein
      said command computer computes, from the energy delivered to the electrical power bus and from the computational work by each said compute unit, an assessment of energy consumption for each of the compute units, and applies the assessment of the energy consumption so as to change the network.

2. The apparatus of claim 1, wherein the assessment of energy consumption for each of the compute units is applied to change the network by reconfiguring the network's structure.

3. The apparatus of claim 1, wherein the compute units each
  report the computational work performed, over the communication fabric, to a database to save the computational work, the energy meter reports, responsive to a command computer query, the energy delivered to the electrical power bus for storage in the database, and the assessment of energy consumption for each of the compute units is saved in the database, and the assessment of energy consumption for each of the compute units is applied by the command computer so that the network is changed by a regulation of on/off power respectively, via the power control units, to the compute units.

4. The apparatus of claim 3, wherein the database is at a logging computer at a site where the compute units are located, and the command computer is not located at the site where the compute units are located so as to enable remote control over the compute units.

5. The apparatus of claim 1, wherein the command computer
  directs the compute units on and off to determine baseline power consumption so as to enable the command computer to compute the assessment of energy consumption for each of the compute units.

6. The apparatus of claim 1, wherein the command computer
  is adapted to configure the computational work performed by compute units to determine baseline power consumption so as to enable the command computer to compute the assessment of energy consumption for each of the compute units.

7. The apparatus of claim 1, wherein the command computer
  is adapted to configure the computational work performed by compute units so as to enable the command computer to optimize power consumption of at least some of the compute units.

8. The apparatus of claim 1, wherein the command computer
  is adapted to solve a linear system of equations so as to enable the command computer to compute the assessment of energy consumption for each of the compute units.

9. The apparatus of claim 8, wherein the system of linear equations includes:

$$\Delta E = \sum_i \left[ \sum_n A_{in} P_n(t_{i+1}, -t_i) + R_n(H_{i+1,n} - H_{in}) \right]$$

where i is an index of time intervals, n is an index of said compute units, E is energy delivered to the electrical power bus, $t_i$, is a time interval, $P_n$ is a compute unit baseline power, $A_{in}=\{0,1\}$ is a compute unit on off status, with 0 indicating off and 1 indicating on, $H_{in}$ is an amount of compute unit computational work, and $R_n$ is an amount of compute unit energy consumed.

10. The apparatus of claim 1, wherein the communication fabric is arranged to allow communication between the compute units such that the change to the network optimizes power consumption by the network.

11. The apparatus of claim 1, wherein the command computer
is adapted to apply the assessment of energy consumption for each of the compute units to a decision procedure as to when power is inexpensive enough that a computing service can be offered at or below a target amount.

12. The apparatus of claim 1, wherein the command computer
is adapted to apply the assessment of energy consumption for each of the compute units to a decision procedure as to when power is inexpensive enough that a computing service can be offered for cryptocurrency mining at or below a target amount.

13. The apparatus of claim 1, wherein the command computer
is adapted to apply the assessment of energy consumption for each of the compute units such that the network is changed by a regulation of on/off power to at least some of the computer units.

14. The apparatus of claim 1, wherein the command computer
is adapted to apply the assessment of energy consumption for each of the compute units such that the network is changed by a regulation of computational work assigned by the command computer to at least some of the computer units.

15. The apparatus of claim 1, wherein the command computer is adapted to apply the assessment of energy consumption for each of the compute units to produce a determination of whether a computation or certain computing is feasible according to at least one predetermined criterion.

16. The apparatus of claim 1, wherein the command computer is adapted to apply the assessment of energy consumption for each of the compute units such that the network is changed by a rearrangement of the compute units such that the computational work corresponding to one of the compute units is carried out by a set of the compute units.

17. The apparatus of claim 1, wherein one or more of the compute units are known by the command computer as compute units of an entity, and the assessment of energy consumption for each of the compute units is applied, by the command computer, such that the network is changed by allocating said one or more of the compute units of the entity to another entity.

18. The apparatus of claim 1, wherein at least some of the compute units are known by the command computer as compute units of an entity, and the assessment of energy consumption for each of the compute units is applied, by the command computer, to at least one computing farm so as to prioritize siting computational resources.

19. The apparatus of claim 1, wherein the command computer
either assesses the energy consumption of, or applies a previous energy assessment to, an other compute unit added to the compute units.

20. The apparatus of claim 1, wherein, after removal of one of
said compute units, the command computer either assesses the energy consumption of each remaining compute unit, or applies a previous energy assessment stored in a database, to assess energy consumption of each said remaining compute unit.

21. A method of making a network according to claim 1, the method including:
connecting a command computer to a network comprising a communication fabric that allows communication between said command computer and compute units that each perform computational work, not all of the compute units having an individual electrical power meter, one or more of the compute units operably associated with a power control unit located to control flow of electrical power to said one or more compute units, each said power control unit connected to an electrical power bus that delivers electrical power to each said power control unit, and an energy meter connected to the electrical power bus so as to measure energy delivered to the electrical power bus, and
changing the network by said command computer:
computing, from the measured energy delivered to the electrical power bus and from the computational work performed by each said compute unit, an assessment of energy consumption for each of the compute units, and
applying the assessment of the energy consumption so as to carry out the changing of the network.

22. The method of claim 21, further including linking a database:
to the compute units so that the compute units, that report the computational work performed, communicate over the communication fabric to the database that saves the reported computational work performed,
to the energy meter so that, responsive to a command computer query, the measured energy delivered to the electrical power bus is communicated to, and stored in, the database, and
such that the assessment of energy consumption for each of the compute units is communicated to, and stored in the database, and wherein:
the changing of the network includes regulating on/off power, via the power control units, to the compute units.

23. The method of claim 21, wherein the computing includes solving, by the command computer, a linear system of equations so as to enable the command computer to compute the assessment of energy consumption for each of the compute units.

24. The method of claim 21, wherein the applying includes applying the assessment of energy consumption for each of the compute units to a decision procedure as to when power is inexpensive enough that a computing service can be offered at or below a target amount.

25. The method of claim 21, wherein the applying includes applying the assessment of energy consumption for each of the compute units to a decision procedure as to when power is inexpensive enough that a computing service can be offered for cryptocurrency mining at or below a target amount.

26. The method of claim 21, wherein the applying either includes assessing the energy consumption of, or applying a previous energy assessment to, an addition of an other compute unit to the compute units.

27. A method of using the network claim 1, the method including:
performing computational work, by compute units, not all of the compute units having an individual electrical power meter;

controlling flow of electrical power to one or more of the compute units, by a power control unit corresponding to each of the one or more of the compute units, delivering, over an electrical power bus, the electrical power to each said power control unit, measuring, by an energy meter, energy delivered to the electrical power bus, communicating, by a command computer, with the compute units, and allowing, over a communication fabric, the communicating between the compute units and the command computer;

computing, by the command computer, from the measured energy delivered to the electrical power bus and from the computational work by each said compute unit, an assessment of energy consumption for each of the compute units, and applying, by the command computer, the assessment of the energy consumption so as to change the network.

28. The method of claim 27, further including:

reporting, by each of the compute units, the computational work performed, over the communication fabric, to a database so as to save the reported computational work, reporting, by the energy meter responsive to a command computer query, the energy delivered to the electrical power bus so as to save the reported energy in the database, and saving, the assessment of energy consumption for each of the compute units in the database, and wherein:

the applying is carried out so that the network is changed by a regulation of on/off power respectively, via the power control units, to the compute units.

29. The method of claim 27, wherein the applying includes applying the assessment of energy consumption for each of the compute units to a decision procedure as to when power is inexpensive enough that a computing service can be offered at or below a target amount.

30. The method of claim 27, wherein the applying includes applying the assessment of energy consumption for each of the compute units to a decision procedure as to when power is inexpensive enough that a computing service can be offered for cryptocurrency mining at or below a target amount.

31. The method of claim 27, wherein the applying includes either assessing the energy consumption of, or applying a previous energy assessment to, an addition of another compute unit to the compute units.

* * * * *